United States Patent [19]
Shen et al.

[11] Patent Number: 5,315,388
[45] Date of Patent: May 24, 1994

[54] MULTIPLE SERIAL ACCESS MEMORY FOR USE IN FEEDBACK SYSTEMS SUCH AS MOTION COMPENSATED TELEVISION

[75] Inventors: Paul Shen, San Diego; Woo H. Paik, Encinitas; Edward A. Krause, San Diego, all of Calif.

[73] Assignee: General Instrument Corporation, Hatboro, Pa.

[21] Appl. No.: 791,369

[22] Filed: Nov. 19, 1991

[51] Int. Cl.⁵ ............................................ H04N 5/907
[52] U.S. Cl. ................................. 348/718; 348/714; 348/402
[58] Field of Search .................... 365/230.03, 230.05, 365/219, 221, 189.02, 189.01, 189.12, 230, 09; 358/22, 160, 167, 36, 105, 21 R; 340/799, 800, 801; 382/41, 42, 44; H04N 5/907

[56] References Cited

U.S. PATENT DOCUMENTS

| | | | |
|---|---|---|---|
| 3,996,559 | 12/1976 | Morrin et al. | 382/44 |
| 4,148,070 | 4/1979 | Taylor | 358/160 |
| 4,275,418 | 6/1981 | Trump et al. | 358/167 |
| 4,296,436 | 10/1981 | Achiha | 358/167 |
| 4,321,695 | 3/1982 | Redwine et al. | |
| 4,541,075 | 9/1985 | Dill et al. | 365/219 X |
| 4,602,275 | 7/1986 | Smith et al. | 358/11 |
| 4,864,402 | 9/1989 | Ebihara et al. | 358/21 R X |
| 4,987,559 | 1/1991 | Miyauchi et al. | 365/189.12 X |
| 5,040,149 | 8/1991 | Ebihara et al. | 365/219 X |
| 5,057,916 | 10/1991 | Krause et al. | 358/105 |

FOREIGN PATENT DOCUMENTS

150935 8/1985 European Pat. Off. .
360243 3/1990 European Pat. Off. .

Primary Examiner—James J. Groody
Assistant Examiner—David E. Harvey
Attorney, Agent, or Firm—Barry R. Lipsitz

[57] ABSTRACT

A multiple serial access memory which includes a dynamic random access memory array is disclosed. The array is randomly addressed to input blocks of data. Address signals are provided to the array to output rows of data. A plurality of serial output ports are coupled to the output of the array for selectively latching different rows of data output from the array. The serial output ports are clocked to output the latched data therefrom. In an illustrated embodiment, each of the serial output ports contains a shift register having a length equal to the width of the memory array. The shift register is responsive to a first timing signal for latching a row of data from the array. A second timing signal actuates the shift register to shift a row of latched data. The serial access selector coupled to the shift register outputs a selected portion of the shifted data from the serial output port. The serial access memory has particular application as the frame store for a motion compensated interframe image coding/decoding system.

20 Claims, 6 Drawing Sheets

MULTIPLE SERIAL ACCESS MEMORY FOR USE IN FEEDBACK SYSTEMS SUCH AS MOTION COMPENSATED TELEVISION

BACKGROUND OF THE INVENTION

The present invention relates to the storage and processing of digital data, and more particularly to a multiple serial access memory for providing a plurality of different data streams from data stored therein. The invention is especially useful in providing a frame store for a motion compensated television system.

Digital transmission of television signals can deliver video and audio services of much higher quality than analog techniques. Digital transmission schemes are particularly advantageous for signals that are broadcast over cable television networks or by satellite to cable television affiliates and/or directly to home satellite television receivers. It is expected that digital television transmitter and receiver systems will replace existing analog systems just as digital compact discs have largely replaced analog phonograph records in the audio industry.

A substantial amount of digital data must be transmitted in any digital television system. This is particularly true where high definition television ("HDTV") is provided. In a digital television system, a subscriber receives the digital data stream via a receiver/descrambler that provides video, audio, and data to the subscriber. In order to most efficiently use the available radio frequency spectrum, it is advantageous to compress the digital television signals to minimize the amount of data that must be transmitted.

The video portion of a television signal comprises a sequence of video images (typically "frames") that together provide a moving picture. In digital television systems, each line of a video frame is defined by a sequence of digital data bits referred to as "pixels." A large amount of data is required to define each video frame of a television signal. For example, 7.4 megabits of data is required to provide one video frame at NTSC (National Television System Committee) resolution. This assumes a 640 pixel by 480 line display is used with 8 bits of intensity value for each of the primary colors red, green, and blue. High definition television requires substantially more data to provide each video frame. In order to manage this amount of data, particularly for HDTV applications, the data must be compressed.

Video compression techniques enable the efficient transmission of digital video signals over conventional communication channels. Such techniques use compression algorithms that take advantage of the correlation among adjacent pixels in order to derive a more efficient representation of the important information in a video signal. The most powerful compression systems not only take advantage of spatial correlation, but can also utilize similarities among adjacent frames to further compact the data.

Motion compensation is one of the most effective tools for accounting for and reducing the amount of temporal redundancy in sequential video frames. One of the most effective ways to apply motion compensation in video compression applications is by differential encoding. In this case, the differences between two consecutive images (e.g., "frames") are attributed to simple movements. The encoder estimates or quantifies these movements by observing the two frames and sends the results to a decoder. The decoder uses the received information to transform the first frame, which is known, in such a way that it can be used to effectively predict the appearance of the second frame, which is unknown.

The encoder reproduces the same prediction frame as the decoder, and then sends the differences between the prediction frame and the actual frame. In this way, the amount of information needed to represent the image sequence can be significantly reduced, particularly when the motion estimation model closely resembles the frame to frame changes that actually occur. This technique can result in a significant reduction in the amount of data that needs to be transmitted once simple coding algorithms are applied to the prediction error signal. An example of such a motion compensated video compression system is described by Ericsson in "Fixed and Adaptive Predictors for Hybrid Predictive/Transform Coding," *IEEE Transactions on Communications*, Vol. COM-33, No. 12, December 1985. An improvement to the system described by Ericsson is disclosed in commonly assigned U.S. Pat. No. 5,057,916 entitled "Method and Apparatus for Refreshing Motion Compensated Sequential Video Images."

Motion compensated television systems require the storage of both current frame and previous frame video data to implement the differential encoding technique described above. Specifically, prior frame data must be summed with a transmitted difference signal to recreate a full current frame for display. The full current frame must be stored for subsequent use in recreating the next frame from a received difference signal. In the past, a dual memory bank system has been used to implement such systems. The same data is stored in both memory banks, allowing it to be accessed independently from each bank. Such an implementation, however, is costly, particularly in HDTV systems where large amounts of memory are required.

It would be advantageous to provide a memory scheme that enables the implementation of a feedback system without the need for redundant memory banks. It would be further advantageous to provide television apparatus that utilizes such a memory scheme to implement motion compensation in an efficient and economical manner. It would be still further advantageous to provide a method for storing video data in a single memory array for use in connection with a television system using motion compensation.

The present invention provides a multiple serial access dynamic random access memory (RAM) and a television system and method having the aforementioned advantages.

SUMMARY OF THE INVENTION

In accordance with the present invention, a multiple serial access memory includes a dynamic random access memory array. Means are provided for addressing the array to input data thereto and output data therefrom. Rows of data are output from the array in response to address signals provided by the addressing means. A plurality of serial output ports, coupled to the outputting means, selectively latch different rows of data output by the outputting means. Means are provided for clocking the serial output ports to output latched data therefrom.

Timing means operatively associated with the array can be provided to limit access to the array to one of the serial output ports at a time. In another embodiment, access to the array by a plurality of serial output ports at the same time is provided, in which case all of the serial output ports concurrently receive the same data.

In an illustrated embodiment, each of the serial output ports comprises a shift register having a length at least equal to a width of the array. The shift register is responsive to a first signal from a timing means for latching a row of data from the array. The shift register is responsive to a second signal from the timing means for shifting the row of latched data. A serial access selector coupled to the shift register outputs a selected portion of the shifted data from the serial output port.

A digital television apparatus is also provided in accordance with the present invention. The apparatus is a type which requires memory for storing a set of working data, such as pixel data from a previous video frame. The apparatus also requires memory for storing a set of display data (e.g., representing a current video frame) derived from the working data. The invention provides a dynamic random access memory array for the television apparatus. Means are provided for addressing the array to input data thereto and output data therefrom. Rows of data are output from the array in response to address signals provided by the addressing means. A plurality of serial output ports coupled to the outputting means selectively latch rows of data output by the outputting means. Means are provided for clocking the serial output ports to output latched data therefrom. At least one of the serial output ports is used to output working data from the array. At least one other of the serial output ports is used to output display data from the array.

Timing means can be operatively associated with the array of the television apparatus for limiting access to the array to one of the serial output ports at a time. Alternatively, several serial output ports can concurrently latch the same data.

In an illustrated embodiment, each of the serial output ports comprises a shift register having a length at least equal to a width of the array. The shift register is responsive to a first signal from a timing means for latching a row of data from the array. The shift register is responsive to a second signal from the timing means for shifting the row of latched data. A serial access selector coupled to the shift register outputs a selected portion of the shifted data from the serial output port.

In one embodiment, the working data is accessed from the array by its respective serial output port in either a field format or a frame format. In this embodiment, the display data is accessed from the array by its respective serial output port in the other of the field format and frame format.

In another embodiment, the working data is accessed from the array by its respective serial output port in a block format. The display data is accessed from the array by its respective serial output port in a television line format.

Where the display data comprises pixel data for a current video frame and the working data comprises pixel data from a previous video frame (for use in reconstructing a current video frame from a motion compensation difference signal), the array has a storage capacity sufficient to store the current video frame together with enough working data to accommodate a predetermined motion estimation search area. The array is filled with data for successive video frames on an ongoing basis, with the data for a current frame overwriting a portion of the data for a previous frame that precedes a current motion estimation search area.

A method in accordance with the present invention stores video data for use by a motion compensator that estimates motion over a maximum horizontal displacement DX and a maximum vertical displacement DY. A frame store memory is provided for storing N+K lines of video data, where N is the number of lines in a video frame and K is at least equal to the number of lines corresponding to the vertical displacement DY. The frame store memory is filled with video data from successive video frames on a revolving basis. N consecutive lines of a second video frame are written into the memory following the last line of a first video frame. In this manner, the first video frame is overwritten by the second video frame on a first-in first-out basis, with the last K lines of the first video frame remaining in the memory once the full second video frame has been written into the memory.

DETAILED DESCRIPTION OF THE INVENTION

Figure 1:
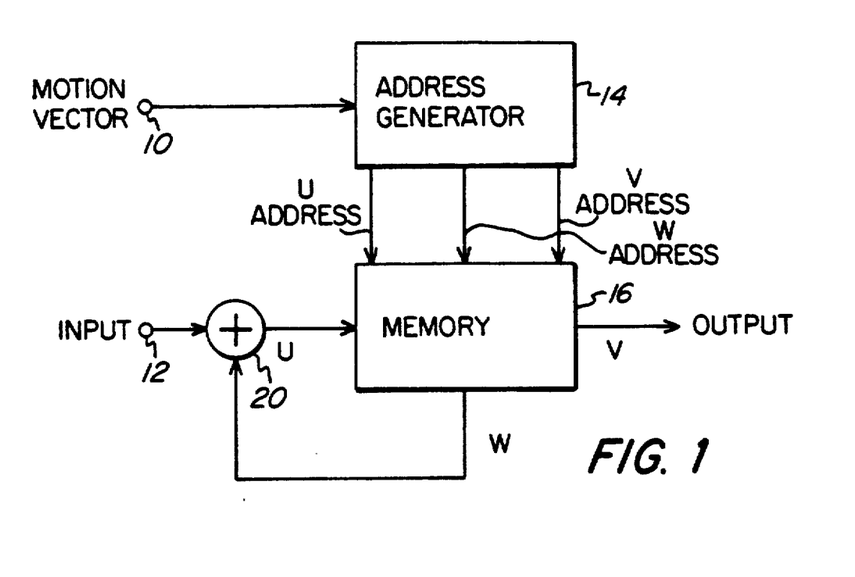
FIG. 1 is a block diagram illustrating a feedback system used by a motion compensated interframe image coding/decoding system.

Various applications exist for a random access memory that can provide a plurality of different output streams from the same stored data. For example, a feedback system such as a motion compensated interframe image coding/decoding system used in digital television requires both working data (i.e., data from a prior video frame) and display data (i.e., the reconstructed data for a current frame to be displayed). Such a feedback system is illustrated generally in FIG. 1. Motion vector data is input to an address generator 14 via a terminal 10. The address generator outputs a u address designating where a current pixel is located in a frame, a w address designating the estimated location of that pixel in the previous frame, and a v address designating the location of data to be displayed. The addresses are input to a memory 16, which serves as a frame store. A motion compensation difference signal is input to a summer 20 via terminal 12. Summer 20 adds the difference signal to the previous frame data w that was used to generate the difference signal in the first place, to recover the current frame video data u. This process can be expressed mathematically as follows:

$$u(u\_address) = w(w\_address) + input(u\_address).$$

In the above equation, u_address identifies where the current pixel is located in a video frame stored in memory 16. Thus, it is the memory address for that pixel. w_address is the estimated location of that pixel in the previous frame, also stored in memory 16. The difference between u_address and w_address is the displacement attributable to movement in the video scene. As well known in the art, the determination of this displacement is often done by a motion estimation method, such as block matching. This determination can be expressed as:

$$w\_address = u\_address + mv,$$

where mv is the motion vector.

In many implementations, the address of the displayed data v is not the same as the address of the current data u. For example, an interlaced television system may use field scanning for display and frame scanning for processing. In field scanning, the odd numbered horizontal television lines are processed as a first field, and the even numbered lines are processed as a second field. When a video picture is reconstructed, the two fields are interleaved so that the horizontal lines are in the proper order. In frame scanning, all of the television lines are processed together, in order, as a single video frame.

If the frame memory 16 in FIG. 1 is organized in a frame format, then the displayed data v is obtained by selecting every second line only. Alternatively, if the frame memory is organized in a field format, then the current data u must be written into memory in a nonsequential order. u_address may also differ from v_address in a noninterlaced television system. For example, this may result from the block-by-block processing that is common in video compression systems. In this case, the displayed data v would still be accessed one line at a time while the current data u and the previous frame data w are accessed one block at a time. Common block sizes for such processing are 8 ×8 pixels and 16×16 pixels.

Figure 2:
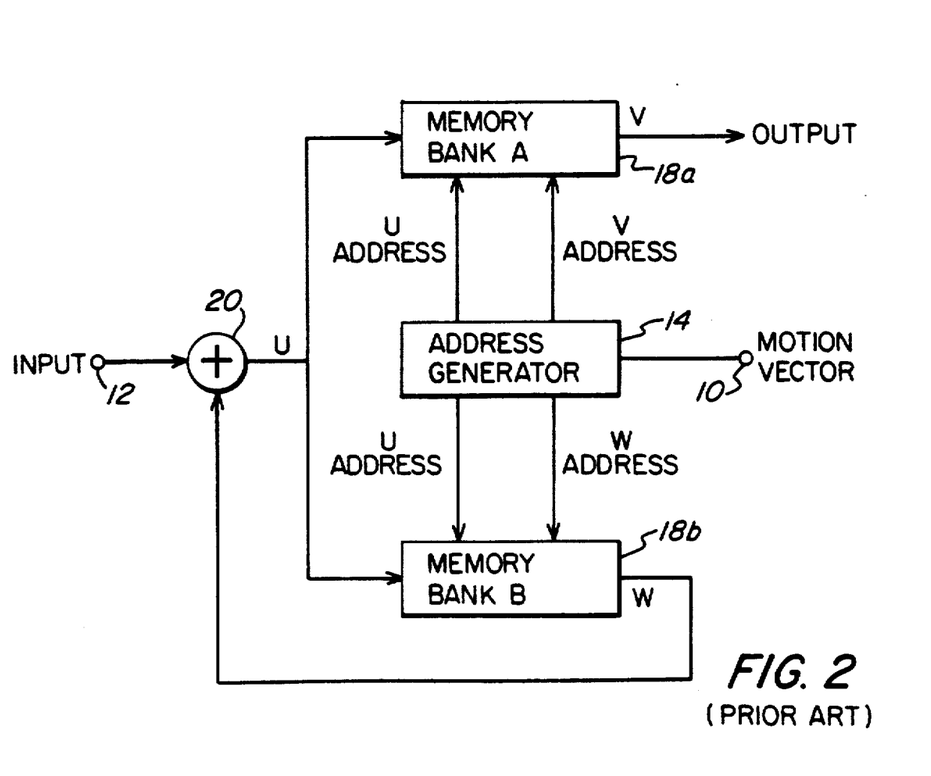
FIG. 2 is a block diagram of a prior art implementation of the feedback scheme of FIG. 1.

The architecture illustrated in FIG. 1, where w_address, u_address, and v_address are each independent, is very difficult to implement with existing dynamic random access memories (DRAM) and video random access memories (VRAM). Thus, the prior art has implemented a dual bank memory system as shown in FIG. 2. In this implementation, there are two memory banks, 18a and 18b. The same data u is stored both in memory bank 18a and 18b. This allows the data to be accessed independently. However, such an implementation is often costly, particularly in HDTV systems where large amounts of memory are required.

The multiple serial access DRAM of the present invention enables the implementation of a feedback system using the architecture illustrated in FIG. 1, wherein only a single memory array is required.

Figure 3:
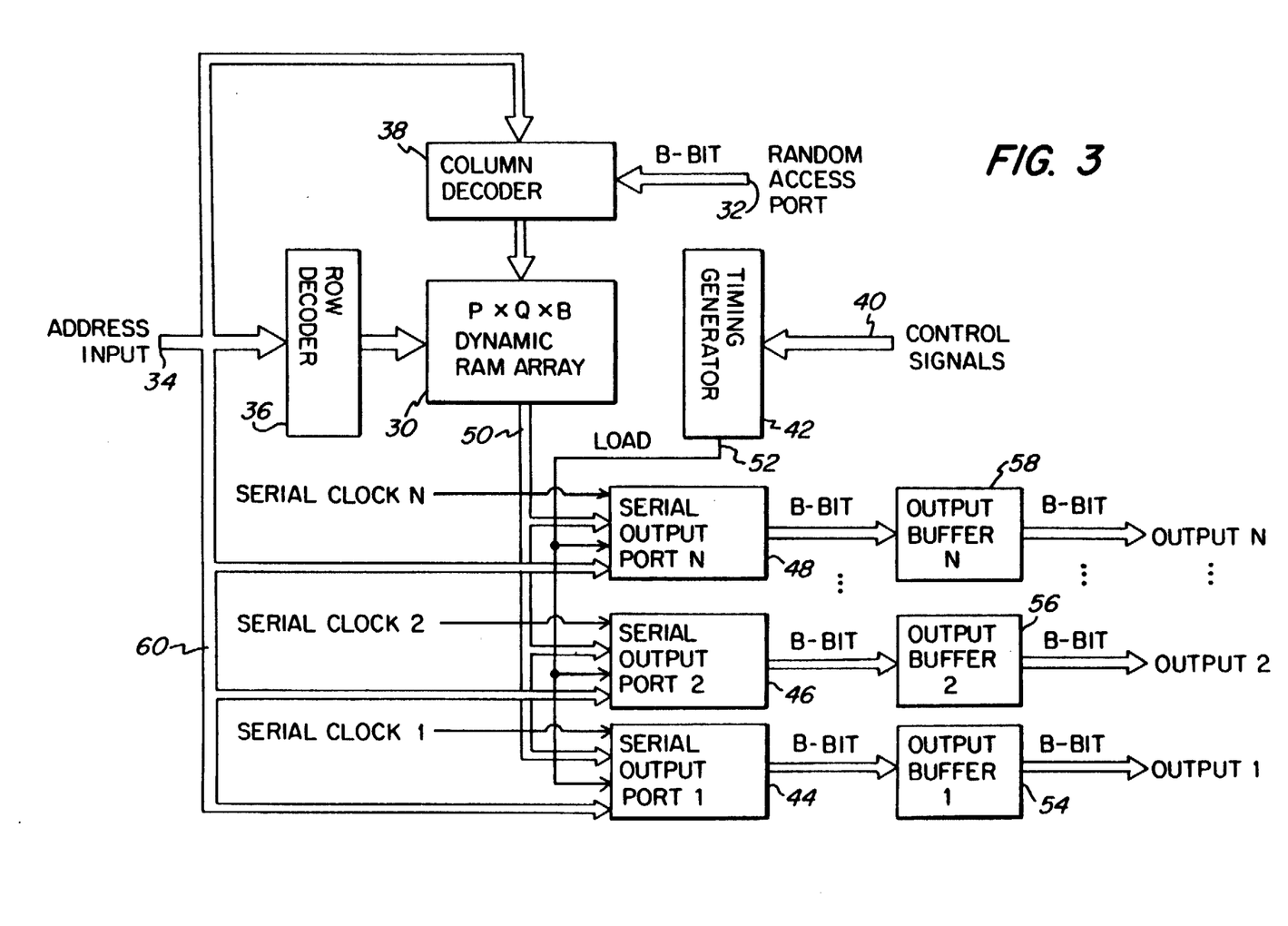
FIG. 3 is a block diagram illustrating a multiple serial access dynamic RAM in accordance with the present invention.

A detailed block diagram of the multiple serial access DRAM of the present invention is provided in FIG. 3. The DRAM contains a conventional random access port 32 for inputting data (DIN), a dynamic RAM array 30, and row and column decoders 36, 38 for accessing the array via an address input 34. In accordance with the present invention, the address input is also coupled to a plurality of serial output ports 44, 46, 48 that receive data via output bus 50 from the DRAM array 30. Although three serial output ports are illustrated in FIG. 3, it should be appreciated that fewer or more such ports can be provided.

The operation of the serial output ports is controlled by a timing generator 42 that is responsive to control signals 40. Serial clocks input to each of the serial output ports control the output of data from each port to a respective output buffer 54, 56, 58. As indicated in the figure, DRAM array 30 is P rows high by Q columns wide by B bits deep. The output from each output buffer is therefore a B-bit byte, although other implementations will be apparent to those skilled in the art.

Figure 6:
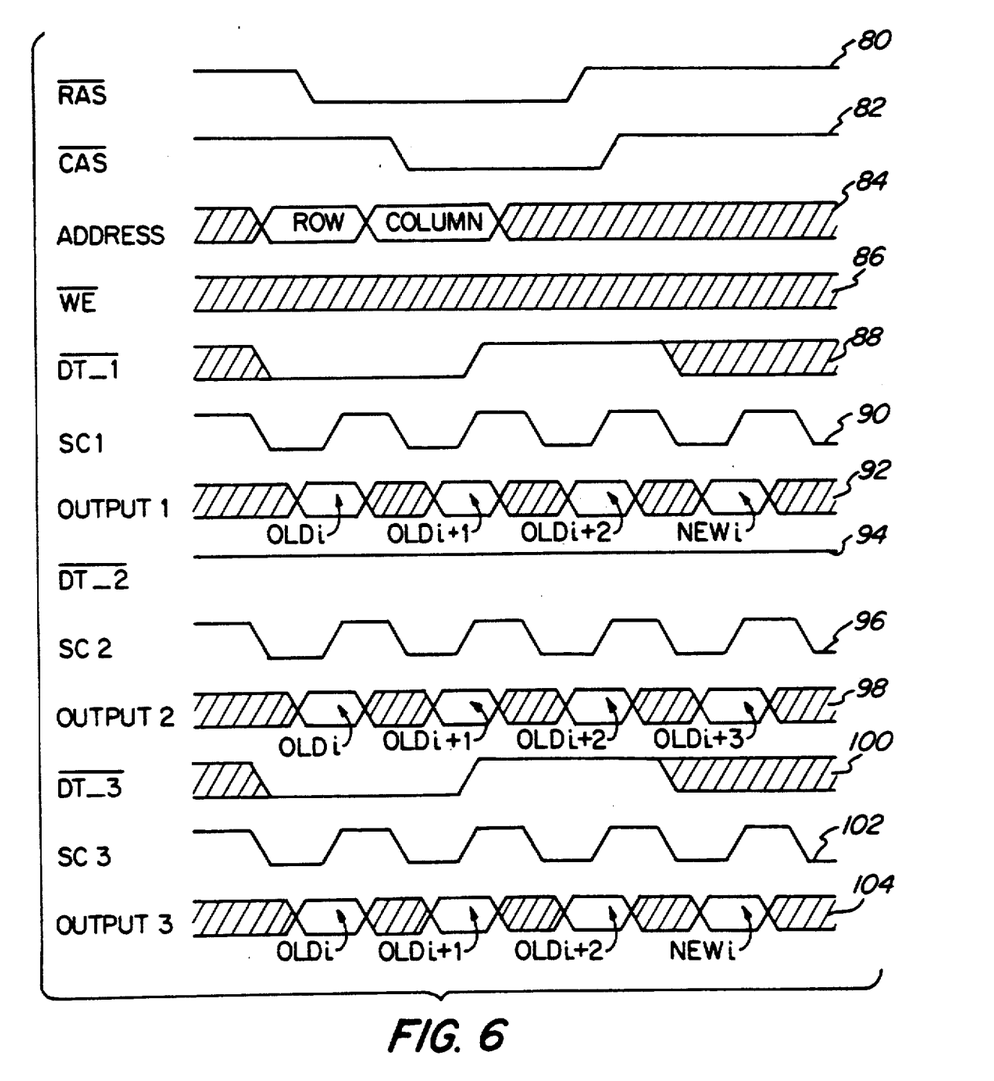
FIG. 6 is a timing diagram illustrating the timing waveforms for individual signals of the multiple access memory during a data transfer cycle.
Figure 7:
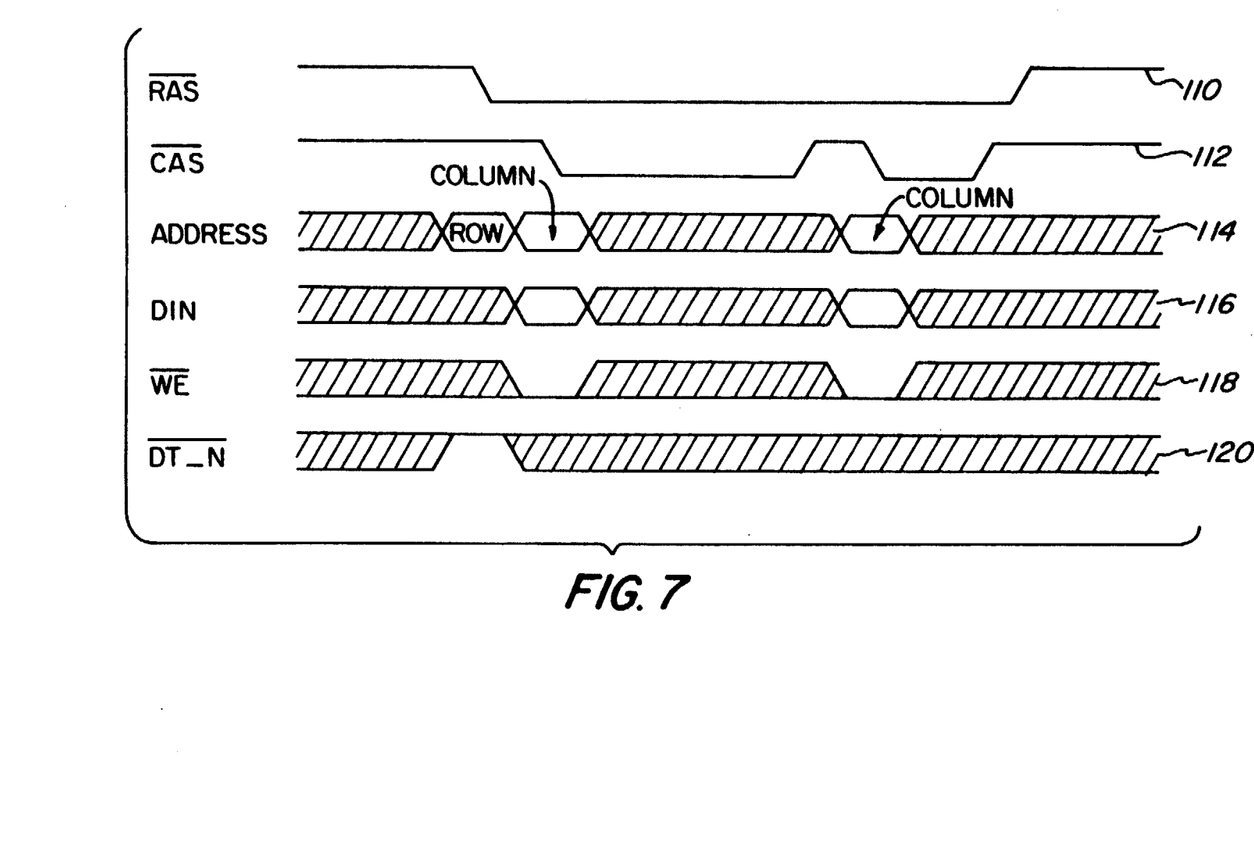
FIG. 7 is a timing diagram illustrating the timing waveforms for individual signals of the multiple access memory during a data write cycle.

The individual control signals 40 input to timing generator 42 include a row access signal $\overline{RAS}$, a column access signal $\overline{CAS}$, a write enable signal $\overline{WE}$, and a separate data transfer signal for each serial output port, $\overline{DT\text{-}1}$ to $\overline{DT\text{-}N}$. Timing diagrams for each of the signals in the data transfer mode of operation are illustrated in FIG. 6. Timing diagrams for a data write cycle are illustrated in FIG. 7.

Figure 4:
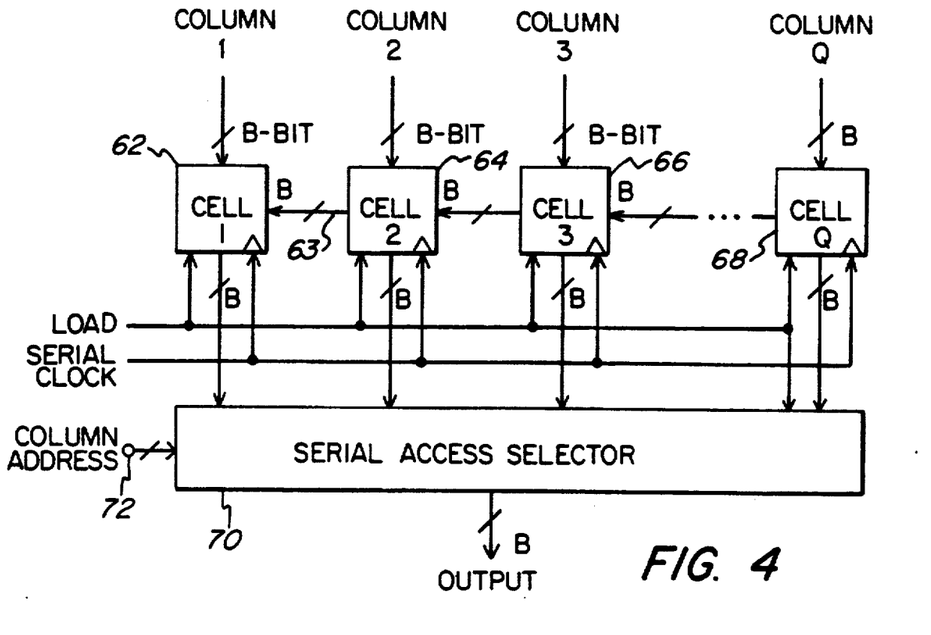
FIG. 4 is a block diagram illustrating one of the serial output ports of FIG. 3 in greater detail.
Figure 5:
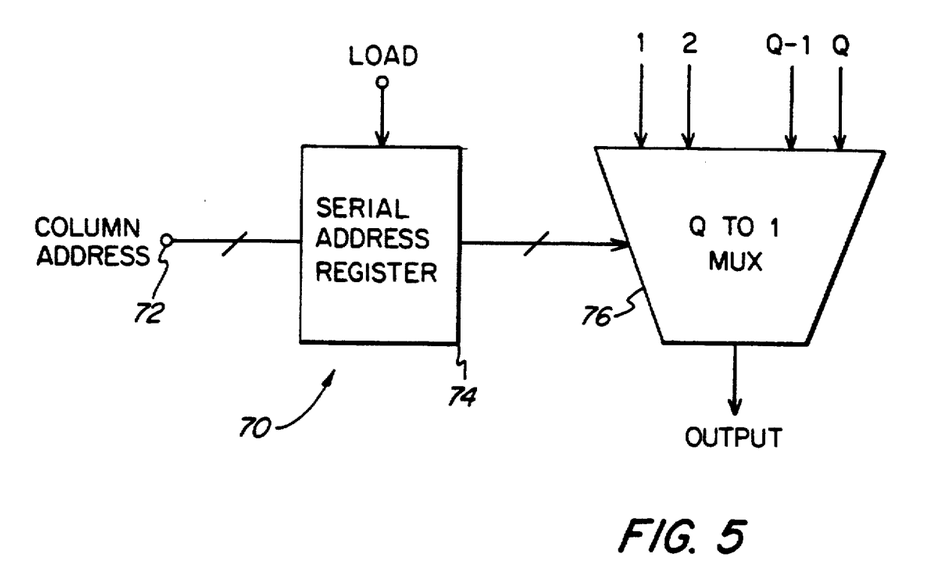
FIG. 5 is a block diagram illustrating the serial access selector of FIG. 4 in greater detail.

FIG. 4 illustrates a serial output port, such as serial output port 44, 46, or 48, in greater detail. The serial output port contains a shift register comprising cells 62, 64, 66, ... 68. As illustrated, one cell is provided for each column of the DRAM array. A serial access selector 70, illustrated in greater detail in FIG. 5, is coupled to the outputs of the shift register cells. As noted, the length of the shift register is the same as the width of the memory array, and each cell is connected to a corresponding column of the memory bank. Thus, $cell_i$ is connected to column i of the memory array. Each cell is also connected to the preceding adjacent cell. For example, an input of $cell_i$ is connected to the output of $cell_{i+1}$. This is illustrated in FIG. 4, where output 63 of cell 64 is coupled to cell 62, and so forth.

Serial port access consists of two steps. These are referred to as "setup" and "readout." In the setup stage, a load signal carried on line 52 from timing generator 42 (FIG. 3) is set high. This latches the selected row of data from DRAM 30 into the shift register comprising cells 62, 64, 66 ... 68. The serial access selector 70 is responsive to a column address input coupled via terminal 72 to output the latched data, commencing from one of the shift register cells identified by the column address input. In other words, although an entire row of data is latched into the shift register when the load signal goes high, it is not necessary to output the entire row of data from the serial access selector. Instead, in applications such as video motion estimation, it may be desired to output a set of data corresponding to a particular movement (i.e., shift) in the video image that occurs from one video frame to the next. In such an instance, the column address input instructs the serial access selector to start outputting data from a cell other than cell 62.

One embodiment of a serial access selector in accordance with the present invention is illustrated in greater detail in FIG. 5. The column address input is latched in a serial address register 74 when the load signal goes low. The latched column address is input to a Q to 1 multiplexer 76, that receives the shift register outputs for each of columns 1 to Q, and initially outputs the column data from a cell identified by the column address. Thereafter, a shifting operation takes place as long as the load signal remains low. For every serial clock cycle, $cell_i = cell_{i+1}$. This function can be performed independently of other operations. Thus, when the load signal is low, multiplexer 76 will initially output the first byte of data from the cell pointed to by the column address, and continue to output successive bytes of data that are shifted into the designated cell from successive cells of the shift register.

The serial access to a serial port is independent of other serial and random access ports in the multiple access memory of FIG. 3. Access to the dynamic RAM array, however, is not independent. For example, a random access port cannot be used at the same time a serial output port is latching data from the array.

The operation of the memory is coordinated by timing generator 42. FIGS. 6 and 7 provide timing diagrams for the system timing signals during data transfer and data writing cycles, respectively. Referring to FIG. 6, when $\overline{RAS}$ goes low, and any $\overline{DT-N}$ is low, the circuit of FIG. 3 will be in the data transfer mode of operation. All of the serial output port registers having a corresponding $\overline{DT-N}$ signal that is low will latch new data. All other serial output ports will retain their old data. Thus, as shown in FIG. 6, when $\overline{RAS}$ 80 goes low, $\overline{DT-1}$ 88 and $\overline{DT-3}$ 100 are low. $\overline{DT-2}$ 94, on the other hand, is high. As a result, output 1, shown at 92 and output 3, shown at 104 contain new data ("new i") whereas output 2 shown at 98 continues to carry old data (e.g., old i+3).

The serial clocks 90, 96, and 102 for each of the three serial output ports illustrated are used, as described above, to clock data out from the serial output ports to the output buffers 54, 56, 58. Column access signal $\overline{CAS}$ 82 controls the output of the column address as indicated at 84. The row address is output when $\overline{RAS}$ goes low. A write enable signal $\overline{WE}$ shown at 86 controls the writing of data into DRAM array 30.

When the write enable signal goes low, as illustrated at 118 in FIG. 7, data is input to the array via random access port 32 as indicated by the waveform "DIN" at 116 in FIG. 7. The status of the $\overline{RAS}$ and $\overline{CAS}$ timing signals 110, 112 respectively during the data write cycle is illustrated in FIG. 7, together with the associated addressing information illustrated at 114. In order to operate in the write cycle, the $\overline{DT-N}$ signals corresponding to each of the serial output ports must be high, as illustrated at 120 in FIG. 7.

A feedback system as illustrated in FIG. 1 can be easily implemented by using the multiple serial access DRAM of the present invention. Memory 16 is the multiple serial access DRAM illustrated in FIG. 3. Typically, the current data u is input to the random access port 32. The output data v is obtained from one of the serial output ports 44, 46, 48. The feedback data w is obtained from another serial output port.

In using the multiple access memory of the present invention in a television system, where motion compensation is not used, it is possible to equate the addresses of the current frame data u and the previous frame data w. The previous frame data is simply summed with the new input data and then written back into the same memory address. However, in a motion compensated system, where the previous frame address is derived by adding a motion vector displacement to the current frame address, it becomes necessary to isolate the two video frames. Otherwise, since the motion vector can be unpredictable and may vary from one region to the next, it is very likely that the current frame data will overwrite the previous frame data that is required to predict the value of the pixels which follow.

It is possible to implement a motion compensation system in accordance with the present invention, using only slightly more than one frame of memory. The additional memory that is required can be expressed as:

$$DX + DY*M*b,$$

where DX and DY are the maximum horizontal and vertical displacements, respectively, of the motion estimator. M is the number of pixels in each line of video, and b is the number of bits used to represent each pixel sample. In a preferred embodiment, the amount of additional memory required is rounded up to simplify the design, and expressed as a number of lines such that the required extra memory equals DY+1. For example, an NTSC video compression system consisting of 480 lines of active video, and having a motion estimator vertical displacement limited to 31 lines, can be implemented using a 512 line frame memory. Similarly, a 1050 line high definition video compression system that contains 960 lines of active video and uses a maximum vertical displacement of 63 lines, can be implemented using a 1024 line frame memory.

Figure 8A:
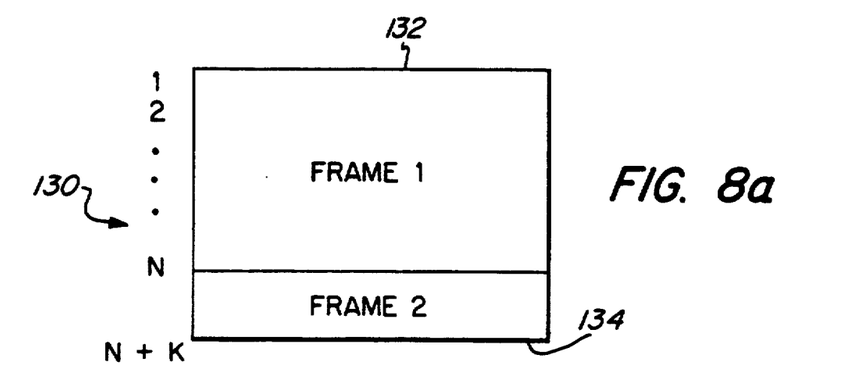
FIGS. 8a to 8c are diagrammatic illustrations showing how the memory is filled with successive frames of video data.
Figure 8B:
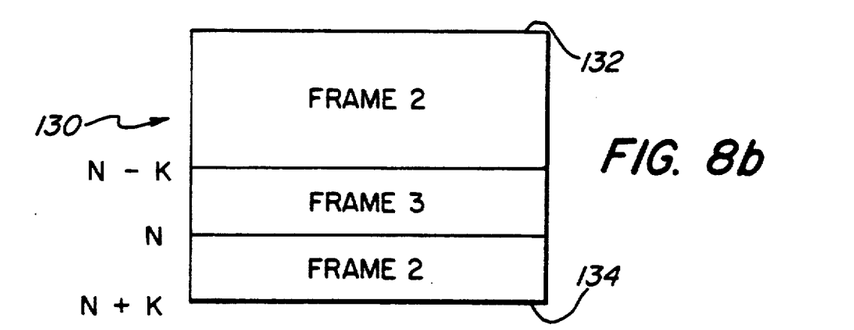
Figure 8C:
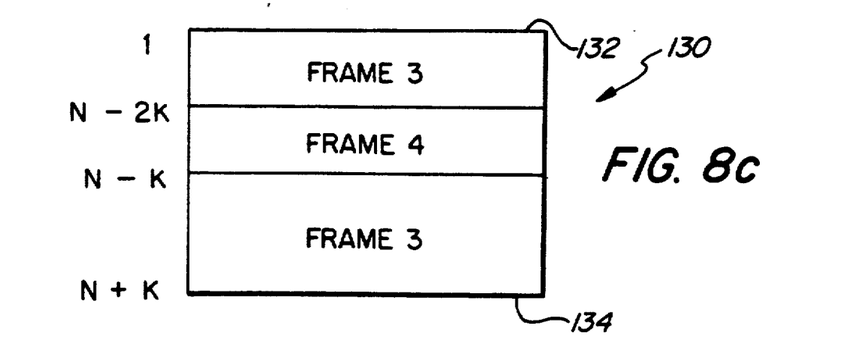

An implementation of the dynamic RAM array used in a motion compensated television system is illustrated in FIGS. 8a to 8c. Each video frame contains N lines. The vertical size of the memory array 130 is large enough to accommodate N+K lines where K is greater than or equal to DY+1. A first frame of video is written into the first N lines commencing at the top 132 of the frame memory 130 as illustrated in FIG. 8a. The next frame begins immediately after the last line of the previous frame. This next frame continues to be written within the frame memory 130 until the memory is filled all the way to the bottom 134. At this point, the new data for the incoming frame wraps around and continues to fill frame memory 130 from the top 132 thereof. In this manner, the prior frame data required by the motion estimator vertical displacement is always present within the frame memory 130. As illustrated in FIG. 8b, after the second frame of data has been read into the frame memory 130, the data from the third frame is read in. This data overwrites the second frame as it approaches the bottom 134 of the frame memory 130, as illustrated in FIG. 8c. Then, the frame 3 data wraps around to continue to fill the frame memory 130 from the top 132 thereof. The process continues on a revolving basis as new frames of video data are received.

Since the previous frame of video data is offset within the frame memory 130 from the current frame by K lines, the relationship between the current and previous frame addresses becomes:

$$w\_address = u\_address + mv - K*M.$$

As already noted, mv is the motion vector, K is the number of extra lines provided for in the frame memory 130, and M is the number of pixels per line. Since a frame of video may be split across the frame memory boundaries, it is necessary to use the modulo remainder of (N+K)*M (i.e., the frame memory size) when deriving the previous frame address.

It should now be appreciated that the present invention provides a multiple serial access memory, that has particular application in the storage of current frame data and a portion of previous frame data necessary to process motion compensated video image data. A dynamic RAM array is provided having a random access port for inputting data. Input data is written to or read from the DRAM array according to the given row and column address. A plurality of serial output ports are coupled to the output of the DRAM array, each capable of selectively latching and outputting rows of data from the array. It is noted that more than one serial output port can concurrently latch the same row of data from the array, if desired for a particular application. Selective access to the latched data is provided by a serial access selector provided within each serial output port.

Although the invention has been described in connection with a specific embodiment thereof, those skilled in the art will appreciate that numerous adaptations and modifications may be made thereto without departing from the spirit and scope of the invention as set forth in the claims.

What is claimed is:

1. A multiple serial access memory comprising:
   a dynamic random access memory array P rows high by Q columns wide by B bits deep;
   means for addressing said array to randomly input N row high by M column wide blocks of B bit data bytes thereto, where $N<P$ and $M<Q$;
   means for outputting rows of data of length L from said array in response to address signals provided by said addressing means, where $M<L<Q$;
   a plurality of serial output ports coupled to said outputting means for selectively latching rows of data output by said outputting means; and
   means for clocking said serial output ports to output latched data therefrom.

2. A memory in accordance with claim 1 further comprising:
   timing means operatively associated with said array for limiting access to said array to one of said serial output ports at a time.

3. A memory in accordance with claim 1 wherein each of said serial output ports comprises:
   a shift register having a length at least equal to a width of said array, said shift register being responsive to a first signal from a timing means for latching a row of data from said array and responsive to a second signal from said timing means for shifting the row of latched data; and
   a serial access selector coupled to said shift register for outputting a selected portion of the shifted data from the serial output port.

4. In a digital television apparatus that requires memory for storing a set of working data and memory for storing a set of display data derived from said working data, the improvement comprising:
   a dynamic random access memory array P rows high by Q columns wide by B bits deep;
   means for addressing said array to randomly input N row high by M column wide blocks of B bit data bytes thereto, where $N<P$ and $M<Q$;
   means for outputting rows of data of length L from said array in response to address signals provided by said addressing means, where $M<L<Q$;
   a plurality of serial output ports coupled to said outputting means for selectively latching rows of data output by said outputting means; and
   means for clocking said serial output ports to output latched data therefrom;
   wherein at least one of said serial output ports is used to output working data from said array and at least one other of said serial output ports is used to output display data from said array.

5. Television apparatus in accordance with claim 4 further comprising:
   timing means operatively associated with said array for limiting access to said array to one of said serial output ports at a time.

6. Television apparatus in accordance with claim 4 wherein each of said serial output ports comprises:
   a shift register having a length at least equal to a width of said array, said shift register being responsive to a first signal from a timing means for latching a row of data from said array and responsive to a second signal from said timing means for shifting the row of latched data; and
   a serial access selector coupled to said shift register for outputting a selected portion of the shifted data from the serial output port.

7. Television apparatus in accordance with claim 4 wherein:
   said working data is provided from the array to its respective serial output port in one of a field format and frame format; and
   said display data is provided from the array to its respective serial output port in the other of said field format and frame format.

8. Television apparatus in accordance with claim 4 wherein:
   said working data is provided from the array to its respective serial output port in an NxM block format, where N is a plurality of television lines and M is a number of pixels less than the number of pixels contained in a full television line; and
   said display data is provided from the array to its respective serial output port in a television line format.

9. Television apparatus in accordance with claim 4 wherein:
   said display data comprises pixel data for a current video frame;
   said working data comprises pixel data from a previous video frame for use in reconstructing a current video frame from a motion compensation difference signal;
   said array has a storage capacity sufficient to store said current video frame together with enough working data to accommodate a predetermined motion estimation search area; and
   said array is filled with data for successive video frames on an ongoing basis with the data for a current frame overwriting a portion of the data for a previous frame that precedes a current motion estimation search area.

10. A method for storing video data for use by a motion compensator including a motion estimator that estimates motion over a maximum horizontal displacement DX and a maximum vertical displacement DY, comprising the steps of:
    providing a frame store memory for storing N+K lines of video data, where N is the number of lines in a video frame and K is at least equal to the number of lines corresponding to the maximum vertical displacement DY of the motion estimator; and
    filling said frame store memory with video data from successive video frames on a revolving basis, wherein N consecutive lines of a second video frame are written into said memory following the last line of a first video frame, such that the first video frame is overwritten by the second video frame on a first-in first-out basis, with the last K lines of the first video frame remaining in said memory once the full second video frame has been written into said memory.

11. A multiple serial access memory comprising:
a dynamic random access memory array;
means for addressing said array to input data thereto and output data therefrom;
means for outputting rows of data from said array in response to address signals provided by said addressing means;
a plurality of serial output ports coupled to said outputting means for selectively latching rows of data output by said outputting means; and
means for clocking said serial output ports to output latched data therefrom;
wherein each of said serial output ports comprises:
a shift register having a length at least equal to a width of said array, said shift register being responsive to a first signal from a timing means for latching a row of data from said array and responsive to a second signal from said timing means for shifting the row of latched data; and
a serial access selector coupled to said shift register for outputting a selected portion of the shifted data from the serial output port.

12. A memory in accordance with claim 11 further comprising:
timing means operatively associated with said array for limiting access to said array to one of said serial output ports at a time.

13. In a digital television apparatus that requires memory for storing a set of working data and memory for storing a set of display data derived from said working data, the improvement comprising:
a dynamic random access memory array;
means for addressing said array to input data thereto and output data therefrom;
means for outputting rows of data from said array in response to address signals provided by said addressing means;
a plurality of serial output ports coupled to said outputting means for selectively latching rows of data output by said outputting means; and
means for clocking said serial output ports to output latched data therefrom;
wherein at least one of said serial output ports is used to output working data from said array and at least one other of said serial output ports is used to output display data from said array and each of said serial output ports comprises:
a shift register having a length at least equal to a width of said array, said shift register being responsive to a first signal from a timing means for latching a row of data from said array and responsive to a second signal from said timing means for shifting the row of latched data; and
a serial access selector coupled to said shift register for outputting a selected portion of the shifted data from the serial output port.

14. A memory in accordance with claim 13 further comprising:
timing means operatively associated with said array for limiting access to said array to one of said serial output ports at a time.

15. In a digital television apparatus that requires memory for storing a set of working data and memory for storing a set of display data derived from said working data, the improvement comprising:
a dynamic random access memory array;
means for addressing said array to input data thereto and output data therefrom;
means for outputting rows of data from said array in response to address signals provided by said addressing means;
a plurality of serial output ports coupled to said outputting means for selectively latching rows of data output by said outputting means;
means for clocking said serial output ports to output latched data therefrom;
at least one of said serial output ports being used to output working data from said array; and
at least one other of said serial output ports being used to output display data from said array; wherein:
said working data is provided from the array to its respective serial output port in one of a field format and frame format; and
said display data is provided from the array to its respective serial output port in the other of said field format and frame format.

16. A memory in accordance with claim 15 further comprising:
timing means operatively associated with said array for limiting access to said array to one of said serial output ports at a time.

17. In a digital television apparatus that requires memory for storing a set of working data nd memory for storing a set of display data derived from said working data, the improvement comprising:
a dynamic random access memory array;
means for addressing said array to input data thereto and output data therefrom;
means for outputting rows of data from said array in response to address signals provided by said addressing means;
a plurality of serial output ports coupled to said outputting means for selectively latching rows of data output by said outputting means;
means for clocking said serial output ports to output latched data therefrom;
at least one of said serial output ports being used to output working data from said array; and
at least one other of said serial output ports being used to output display data from said array; wherein:
said working data is provided from the array to its respective serial output port in an NxM block format, where N is a plurality of television lines and M is a number of pixels less than the number of pixels contained in a full television line; and
said display data is provided from the array to its respective serial output port in a television line format.

18. A memory in accordance with claim 17 further comprising:
timing means operatively associated with said array for limiting access to said array to one of said serial output ports at a time.

19. In a digital television apparatus that requires memory for storing a set of working data and memory for storing a set of display data derived from said working data, the improvement comprising:
a dynamic random access memory array;
means for addressing said array to input data thereto and output data therefrom;

means for outputting rows of data from said array in response to address signals provided by said addressing means;

a plurality of serial output ports coupled to said outputting means for selectively latching rows of data output by said outputting means;

means for clocking said serial output ports to output latched data therefrom;

at least one of said serial output ports being used to output working data from said array; and at least one other of said serial output ports being used to output display data from said array; wherein:

said display data comprises pixel data for a current video frame;

said working data comprises pixel data from a previous video frame for use in reconstructing a current video frame from a motion compensation difference signal;

said array has a storage capacity sufficient to store said current video frame together with enough working data to accommodate a predetermined motion estimation search area; and said array is filled with data for successive video frames on an ongoing basis with the data for a current frame overwriting a portion of the data for a previous frame that precedes a current motion estimation search area.

20. A memory in accordance with claim 19 further comprising:

timing means operatively associated with said array for limiting access to said array to one of said serial output ports at a time.

* * * * *

UNITED STATES PATENT AND TRADEMARK OFFICE
CERTIFICATE OF CORRECTION

PATENT NO. : 5,315,388
DATED : May 24, 1994
INVENTOR(S) : Shen et al

It is certified that error appears in the above-indentified patent and that said Letters Patent is hereby corrected as shown below:

Column 9, line 24, claim 1, "M<L<Q" should be --M<L≤Q--.
Column 9, line 57, claim 12, "M<L<Q" should be --M<L≤Q--.

Signed and Sealed this

Tenth Day of December, 1996

Attest:

BRUCE LEHMAN

Attesting Officer    Commissioner of Patents and Trademarks